United States Patent
Shinriki et al.

(10) Patent No.: US 6,800,139 B1
(45) Date of Patent: Oct. 5, 2004

(54) FILM DEPOSITION APPARATUS AND METHOD

(75) Inventors: Hiroshi Shinriki, Nirasaki (JP); Kenji Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 292 days.

(21) Appl. No.: 09/830,121

(22) PCT Filed: Aug. 30, 2000

(86) PCT No.: PCT/JP00/05858

§ 371 (c)(1),
(2), (4) Date: Jul. 16, 2001

(87) PCT Pub. No.: WO01/16396

PCT Pub. Date: Mar. 8, 2001

(30) Foreign Application Priority Data

Aug. 31, 1999 (JP) .......................................... 11-245836

(51) Int. Cl.[7] ........................ C23C 16/00; H01L 21/306
(52) U.S. Cl. .............. 118/715; 156/345.33; 156/345.34
(58) Field of Search ...................... 118/715; 156/345.33, 156/345.34

(56) References Cited

U.S. PATENT DOCUMENTS

| | | | | |
|---|---|---|---|---|
| 5,532,190 A | * | 7/1996 | Goodyear et al. | 438/710 |
| 5,781,693 A | * | 7/1998 | Ballance et al. | 392/416 |
| 5,950,925 A | * | 9/1999 | Fukunaga et al. | 239/132.3 |
| 5,951,776 A | * | 9/1999 | Selyutin et al. | 118/729 |
| 5,958,140 A | * | 9/1999 | Arami et al. | 118/725 |
| 5,976,261 A | | 11/1999 | Moslehi et al. | 118/719 |
| 6,090,210 A | * | 7/2000 | Ballance et al. | 118/725 |
| 6,126,753 A | * | 10/2000 | Shinriki et al. | 118/715 |
| 6,289,842 B1 | * | 9/2001 | Tompa | 118/723 E |
| 6,294,026 B1 | * | 9/2001 | Roithner et al. | 118/715 |
| 6,302,964 B1 | * | 10/2001 | Umotoy et al. | 118/715 |
| 6,444,039 B1 | * | 9/2002 | Nguyen | 118/715 |
| 6,444,042 B1 | * | 9/2002 | Yang et al. | 118/724 |
| 2003/0000473 A1 | * | 1/2003 | Chae et al. | 118/715 |

FOREIGN PATENT DOCUMENTS

| | | |
|---|---|---|
| EP | 0 821 084 | 1/1998 |
| JP | 61-5515 | 1/1986 |
| JP | 5-152208 | 6/1993 |

\* cited by examiner

Primary Examiner—Jeffrie R. Lund
(74) Attorney, Agent, or Firm—Pillsbury Winthrop LLP

(57) ABSTRACT

A film deposition apparatus (2) forms a PZT film at a high deposition rate under a low temperature by using a single showerhead (50) throughout the deposition process. Process gases including a raw material gas and an oxidant gas are introduced into a process chamber (4) in which a wafer (W) is accommodated. The process chamber (4) is maintained at a predetermined vacuum during the film depositing process. A gas injection surface (57) of the shower head (50) from which the process gases are injected is divided into an inner zone (84) covering a center portion of the wafer (W) and an outer zone (86) surrounding the inner zone (84). The raw material gas is separately injected from the inner zone (84) and the outer zone (86), and the oxidant gas is separately injected from the inner zone (84) and the-outer zone (86).

2 Claims, 8 Drawing Sheets

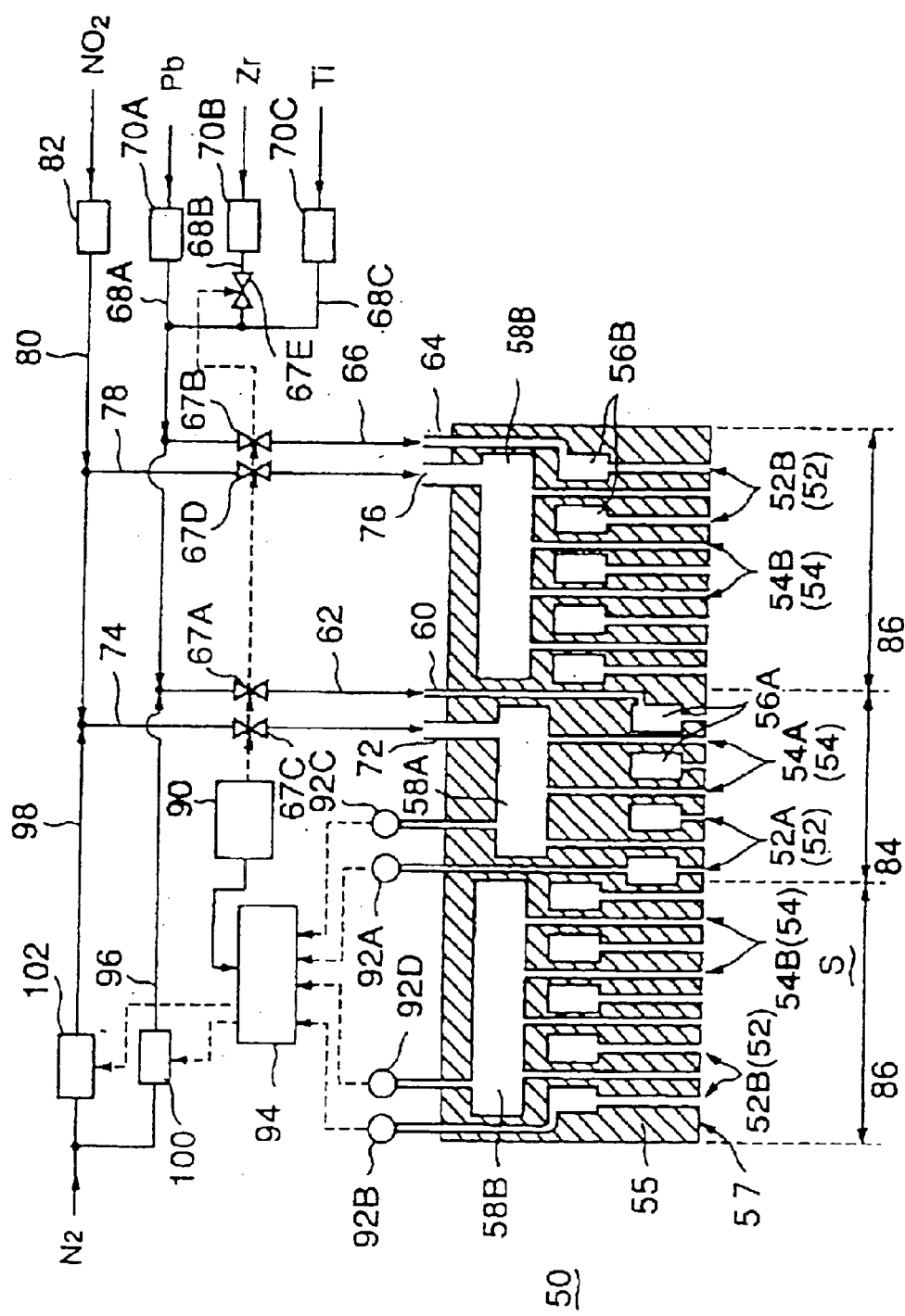

FILM DEPOSITION APPARATUS AND METHOD

This application is the National Phase of International Application PCT/JP00/05858 filed Aug. 30, 2000 which designated the U.S. and that International Application was published under PCT Article 21(2) in English.

TECHNICAL FIELD

The present invention generally relates to a film deposition apparatus and method, and, more particularly, to a film deposition apparatus and method for depositing a PZT film on a semiconductor wafer.

BACKGROUND ART

A PZT film can be obtained as a crystal film of $Pb(Zr_{1-x}Ti x)O_3$ having a perovskite structure by making an organometallic material gas react with an oxidant gas such as $NO_2$ gas in a chemical vapor deposition (CVD) process apparatus. The organometallic material gas contains $Pb(DPM)_2$ (Bisdipivaloyl-methanatolead : $Pb(C_{11}H_{19}O_2)_2$), Zr $(t-OC_4H_9)_4$ (Tetratertiary-butoxyzirconium) and Ti(I-$OC_3H_7)_4$ (Tetraisopropoxy-titanium). Pb refers to lead, Zr refers to zirconium, and Ti refers to titanium. The PZT film has attracted great attention as a memory capacitor material of a second-generation planar stack type FeRAM.

Generally, in order to deposit an oxide film such as a PZT film in a crystal state, a wafer or substrate on which the oxide film is deposited must be heated to a temperature as high as about 600° C. However, in a case in which a structure having weakness against heat is previously formed on the wafer or substrate, the film deposition process must be performed by a two-stage process including a process of forming a crystalline nucleus and a process of growing the crystal so as to decrease the process temperature of the film deposition process. The degrees of vacuum appropriate for the two processes are not always equal to each other. Thus, it is required to perform a low vacuum process and a high vacuum process by using a single chamber. However, since there is no showerhead, which can be used for both the high vacuum process and the low vacuum process, the two-stage process must be performed by using two different chambers.

When an organometallic material (MO) is used in a gaseous state, the organometallic material gas must be heated due to its low vapor pressure. Accordingly, if the organometallic material gas meets an oxidant gas within a supply pipe, the organometallic material gas immediately reacts with the oxidant gas within the supply pipe, which results in deposition or formation of particles within the supply pipe. In order to eliminate such a problem, when the organometallic material gas is used, a post mix type showerhead is normally used so as to mix the organometallic material gas with the oxidant gas after exiting the showerhead. However, it is difficult to eliminate leakage between the organometallic material gas and the oxidant gas in the showerhead due to the construction of the showerhead. That is, there is a small air gap formed between the passages of the organometallic material gas and the oxidant gas due to the fabrication method of the showerhead. Thus, a gas leakage occurs between the areas of the organometallic material gas and the oxidant gas in the showerhead, which results in deposition of the oxidized organometallic material or generation of particles of the oxidized organometallic material.

DISCLOSURE OF INVENTION

It is a general object of the present invention to provide an improved and useful film deposition apparatus and method in which the above-mentioned problems are eliminated.

A more specific object of the present invention is to provide a film deposition apparatus and method which can form a PZT film at a high deposition rate under a low temperature by using a single showerhead throughout the deposition process.

In order to achieve the above-mentioned objects, there is provided according to one aspect of the present invention a film deposition apparatus for depositing a film on an object to be processed, the film deposition apparatus comprising: a process chamber accommodating the object therein; process gas supplying means for supplying process gases including a raw material gas and an oxidant gas; evacuating means for evacuating the process gases from the process chamber so as to maintain the process chamber to be at a predetermined vacuum; and process gas introducing means for introducing the process gases supplied from the process gas supplying means into the process chamber, wherein the process gas introducing means is configured and arranged to inject the process gases to an entire surface of the object, a gas injection surface from which the process gases are injected being divided into an inner zone covering a center portion of the object and an outer zone surrounding the inner zone; and the process gas supplying means selectively supplies the process gases to the process gas introducing means so that the raw material gas is separately injected from the inner zone and the outer zone, and the oxidant gas is separately injected from the inner zone and the outer zone.

According to the above-mentioned invention, crystalline nucleuses can be efficiently formed on the object to be processed such as a wafer by injecting the raw material gas to the center portion of wafer and the oxidant gas to the peripheral portion of the wafer surrounding the center portion while maintaining the process chamber at a high vacuum. After the crystalline nucleuses are formed on the wafer, the crystal of the film can be grown at a high rate by injecting the raw material gas and the oxidant gas uniformly to the entire surface of the wafer at a relatively low temperature while maintaining the process chamber at a relatively low vacuum.

In the film deposition apparatus according to the present invention, the process gas supplying means may include switching means for switching the supply of the raw material gas to the process gas introducing means so that the raw material gas is selectively injected from either the inner zone alone or both the inner zone and the outer zone and the oxidant gas is selectively injected from either the outer zone alone or both the inner zone and the outer zone.

In one embodiment of the present invention, the process gas supplying means may include a first raw material gas supply passage supplying the raw material gas to the inner zone, a second raw material gas supply passage supplying the raw material gas to the outer zone, a first oxidant gas supply passage supplying the oxidant gas to the inner zone and a second oxidant gas supply passage supplying the oxidant gas to the outer zone; and the switching means may include a first open/close valve provided to the first raw material gas supply passage, a second open/close valve provided to the second raw material gas passage, a third open/close valve provided to the first oxidant gas supplying passage and a fourth open/close valve provided to the second oxidant gas supply passage.

Additionally, the raw material gas may be a mixture of a plurality of material gases, and the process gas supplying means may include: a plurality of material gas supplying passages; and an open/close valve provided to one of the material gas supplying passages so that the material gas supplied through the one of the material gas supplying passages is selectively added to the raw material gas.

The process chamber may include a table on which the object is placed; and a vertical moving mechanism for moving the table in a vertical direction so that a distance between the table and the process gas introducing means is changeable. Accordingly, when the film deposition process is performed at a high vacuum so as to form crystalline nucleuses, the distance between the wafer and the shower head can be increased so that the raw material gas and the oxidant gas are uniformly mixed to each other by diffusion, which results in a uniform composition of the deposited film.

The film deposition apparatus according to the present invention may further comprise: pressure detecting means for detecting a pressure of each of the raw material gas and the oxidant gas in said process gas introducing means; dilution gas adding means for adding a dilution gas to one of the raw material gas and the oxidant gas; and dilution gas amount control means for controlling an amount of the dilution gas to be added based on the pressure detected by the pressure detecting means so that the pressures of the raw material gas and the oxidant gas in the process gas introducing means are substantially equal to each other. Accordingly, there is no pressure difference between the raw material gas and the oxidant gas in the process gas introducing means. Thus, there is no leakage between the spaces provided with the raw material gas and the oxidant gas, and the raw material gas and the oxidant gas do not reversely flow into the process gas introducing means after exiting therefrom. Thus, the premature reaction of the raw material gas and the oxidant gas in the process gas introducing means can be prevented.

In one embodiment of the present invention, the process gas introducing means may comprise a showerhead having a plurality of raw material gas injection openings and a plurality of oxidant gas injection openings uniformly arranged on a bottom surface thereof, the bottom surface corresponding to the gas injection surface divided into the inner zone and the outer zone, the showerhead including: an inner raw material gas head space connected to the first raw material gas supply passage, a part of the injection openings located in the inner zone being connected to the inner raw material head space; an outer raw material gas head space connected to the second raw material gas supply passage, a part of the injection openings located in the outer zone being connected to the outer raw material head space; an inner oxidant gas head space connected to the first oxidant gas supply passage, a part of the injection openings located in the inner zone being connected to the inner oxidant gas head space; and an outer oxidant gas head space connected to the second oxidant gas supply passage, a part of the injection openings located in the outer zone being connected to the outer oxidant gas head space.

Additionally, there is provided according another aspect of the present invention a film deposition method for forming a film on an object in a process chamber by introducing a raw material gas and an oxidant gas from a showerhead to the process chamber, the film deposition method comprising: a first process of injecting a raw material gas to a first area directly above a center portion of the object and an oxidant gas to a second area directly above a peripheral portion of the object surrounding the center portion while maintaining the process chamber at a first predetermined vacuum; and a second process of injecting the raw material gas and the oxidant gas while maintaining the process chamber at a second predetermined vacuum lower than the first predetermined vacuum.

According to the above-mentioned invention, in the first process, crystalline nucleuses can be efficiently formed on the object to be processed such as a wafer by injecting the raw material gas to the center portion of wafer and the oxidant gas to the peripheral portion of the wafer surrounding the center portion while maintaining the process chamber at a high vacuum. After the crystalline nucleuses are formed on the wafer in the first process, the second process is performed. In the second process, the crystal of the film can be grown at a high rate by injecting the raw material gas and the oxidant gas uniformly to the entire surface of the wafer at a relatively low temperature while maintaining the process chamber at a relatively low vacuum.

Additionally, in the second process, the raw material gas and the oxidant gas may be uniformly injected to both-the first area and the second area.

The film deposition method according to the present invention may further comprise vertically moving the object in the process chamber so that a distance between the showerhead and the object is changed between the first process and the second process. The distance in the first process may be set to be greater than the distance in the second process. Accordingly, when the film deposition process is performed at a high vacuum in the first process so as to form crystalline nucleuses, the distance between the wafer and the shower head can be increased so that the raw material gas and the oxidant gas are uniformly mixed to each other by diffusion, which results in a uniform composition of the deposited film.

Additionally, the first and second processes may include detecting a pressure of each of the raw material gas and the oxidant gas, and adding a dilution gas to one of the raw material gas and the oxidant gas whichever has a higher pressure than the other so as to substantially equalize the pressures of the raw material gas and the oxidant gas. Accordingly, there is no pressure difference between the raw material gas and the oxidant gas in the showerhead. Thus, there is no leakage between the spaces provided with the raw material gas and the oxidant gas in the shower head, and the raw material gas and the oxidant gas do not reversely flow into the showerhead after exiting therefrom. Thus, the premature reaction of the raw material gas and the oxidant gas in the showerhead can be prevented.

In one embodiment of the present invention to deposit a PZT film, the raw material gas supplied in the second process may be an organometallic mixture gas containing $Pb(DPM)_2$, at least one of $Zr(t-OC_4H_9)_4$, $Zr(DPM)_4$, $Zr(I-OC_3H_7)_4$, $Zr(C_5H_7O_2)_4$ and $Zr(C_5HF_6O_2)_4$ and at least one of $Ti(i-OC_3H_7)_4$ and $Ti(i-OC_3H_7)_2(DPM)_2$; the raw material gas in the first process may be the organometallic mixture gas lacking the Zr material gas; and the oxidant gas supplied in the first and second processes may be at least one selected from a group consisting of $NO_2$, $O_2$, $O_3$ and $N_2O$.

Additionally, the first predetermined vacuum may be equal to or lower than 100 mTorr, and the second predetermined vacuum may be higher than 100 mTorr.

Other objects, features and advantages of the present invention will become more apparent from the following detailed description when read in conjunction with the accompanying drawings.

BRIEF DESCRIPTION OF DRAWINGS

FIG. 3 is a cross-sectional view of the showerhead shown in FIG. 1;

BEST MODE FOR CARRYING OUT THE INVENTION

The inventors made the present invention based on the discovery that a good quality PZT film can be a formed at a high deposition rate at a low temperature by initially supplying a raw material gas from the center of a showerhead and supplying an oxidant gas around the raw material gas so as to from crystalline nucleuses under a high vacuum environment, and thereafter growing the crystal of the PZT film in a state in which the raw material gas and the oxidant gas are uniformly supplied from the entire surface of the showerhead.

Figure 1:
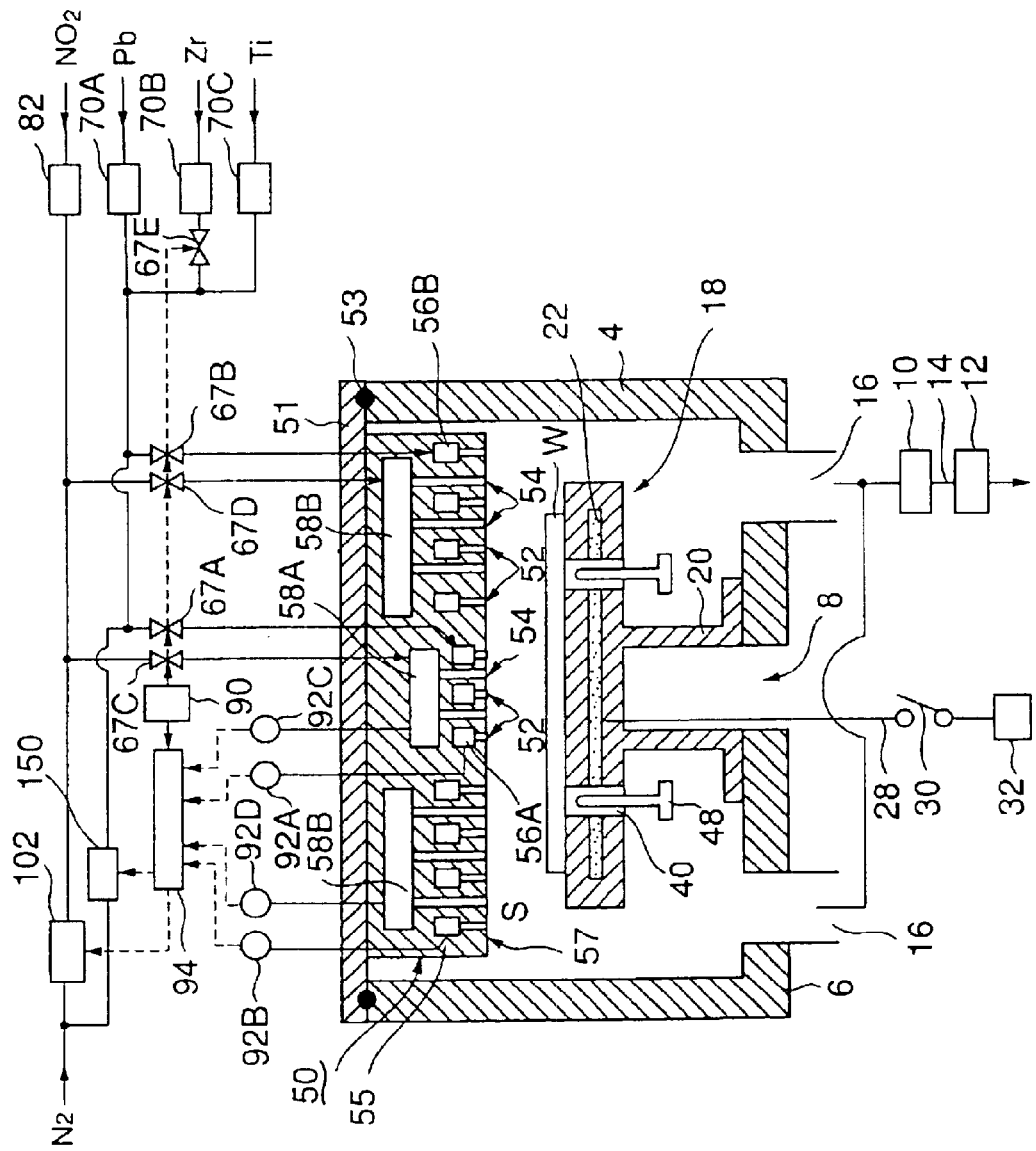
FIG. 1 is a structural diagram of a film deposition apparatus according to a first embodiment of the present invention.
Figure 2:
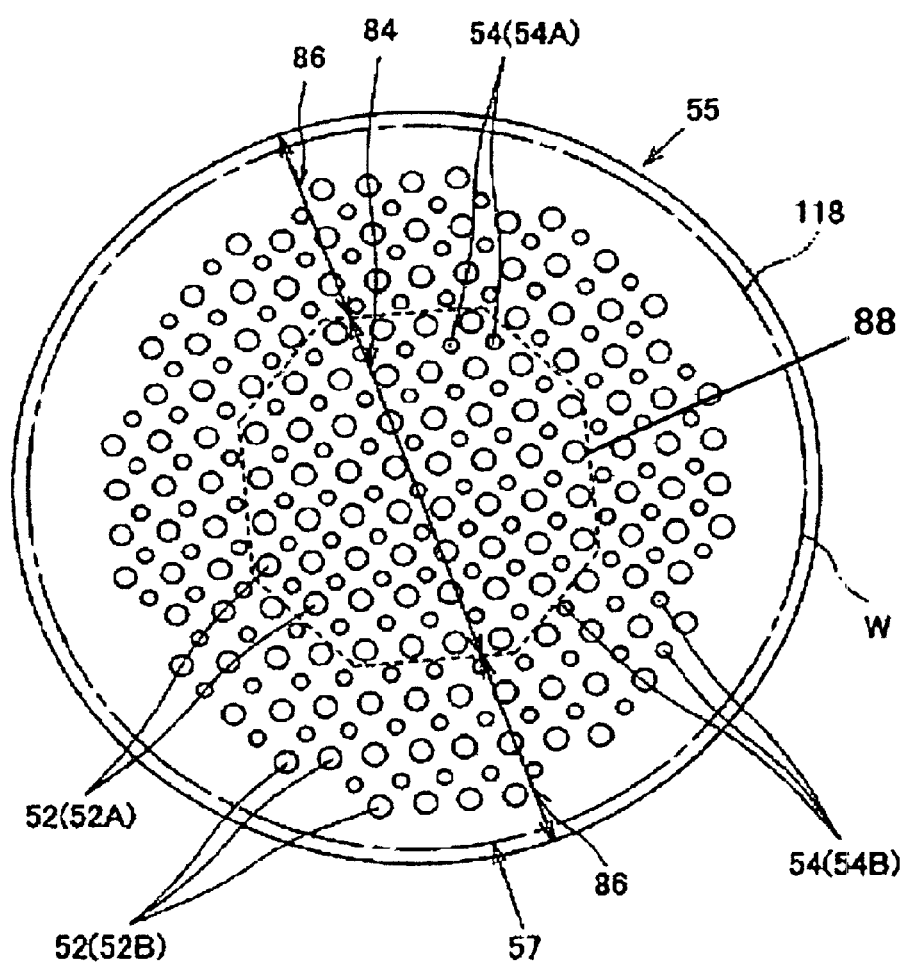
FIG. 2 is a plan view of a showerhead provided in the film deposition apparatus shown in FIG. 1.
Figure 4A:
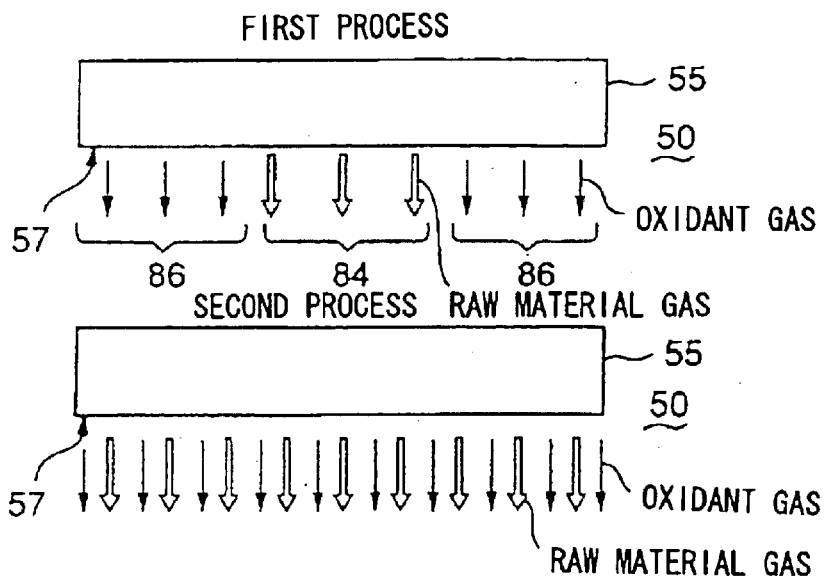
FIG. 4A is an illustration for explaining gas flow in a first process.
Figure 4B:
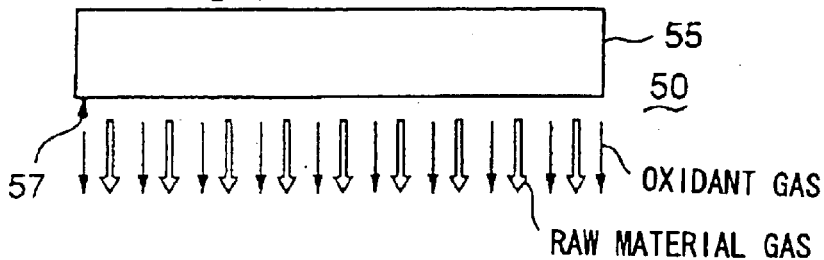
FIG. 4B is an illustration for explaining gas flow in a second process.

A description will now be given, with reference to FIGS. 1 to 6, of a first embodiment of the present invention. FIG. 1 is a structural diagram of a film deposition apparatus according to the first embodiment of the present invention. FIG. 2 is a plan view of a showerhead provided in the film deposition apparatus shown in FIG. 1, viewed from the bottom side. FIG. 3 is a cross-sectional view of the showerhead shown in FIG. 1.

In the present embodiment, $Pb(DPM)_2$, $Zr(t-OC_4H_9)_4$ and $Ti(I-OC_3H_7)_4$ are used as material gases, which are mixed with each other so as to prepare the raw material gas, and $NO_2$ gas is used as an oxidant gas so as to deposit a PZT film.

The film deposition apparatus 2 shown in FIG. 1 comprises a cylindrical process chamber 4 made of aluminum. In the center of a bottom 6 of the process chamber 4, an opening 8 is formed so as to provide a power supply line. A plurality of exhaust openings 16 are formed in the periphery of the bottom 6. The exhaust openings 16 are connected to a vacuum line 14 including a turbomolecular pump 10 and a dry pump 12 so as to evacuate gases in the process chamber 4. The exhaust openings 16 are arranged along a circumference of the bottom 6 at equal intervals.

A disc-like table 18 made of a non-conductive material such as alumina is provided in the process chamber 4. The table 18 includes a leg portion 20 having a hollow cylindrical shape. The leg portion 20 extends downward from the center of the bottom of the table 18. The bottom end of the leg portion 20 is connected to the bottom 6 of the process chamber 4 via a bellows and a seal member such as an O-ring (not shown in the figure). The bellows 440 and the O-ring are provided to allow the vertical movement of the table 18 while the interior of the leg portion 20 is hermetically separated from the space inside the process chamber 4.

The table 18 is mounted to an upper end of the leg portion 20 which is movable up and down by a vertical moving mechanism (not shown in the figure). A distance between the table 18 and a showerhead 50 provided above the table 18 can be varied by the vertical movement of the table 18. It should be noted that the showerhead 50 may be vertically moved instead of the table 18.

The table 18 has a heating means. Specifically, a resistance heater 22 made of carbon coated with SiC is incorporated in the table 18. The heater 22 can heat a semiconductor wafer W placed on the table 18 to a desired temperature.

An insulated power supply lead wire 28 is connected to the heater. The lead wire 28 passes through inside the leg portion 20 and the opening 8 so as to extend to outside the process chamber 4. The lead wire 28 is connected to a power source 32 via a switch 30. It should be noted that a heating lamp such as a halogen lamp may be used instead of the resistance heater 22 so as to heat the wafer W on the table 18.

A plurality of lifter openings 40 are provided in the periphery of the table 18, each of which extends in the vertical direction. A wafer lifter pin 48 is accommodated in each of the lifter openings 40 so as to support and lift the wafer W when the wafer W is loaded to or unloaded from the process chamber 4 by being vertically moved by a lifter pin moving mechanism (not shown in the figure). Normally, the wafer W is supported by three lifter pins 40.

A top plate 51 is mounted to the top of the process chamber 4 via an O-ring 53 so as to hermetically seal the process chamber 4. The showerhead 50 is mounted on the top plate 51 so that the showerhead 50 serves as a process gas introducing means. The showerhead 50 is located opposite to the table 18 so as to cover the entire top surface of table 18. A process space S is formed between the showerhead 50 and the table 18.

The showerhead 50 is provided to introduce the raw material gas and the oxidant gas into the process chamber 4. A plurality of raw material gas injection openings 52 and a plurality of oxidant gas injection openings 54 are formed in a gas injection surface 57 provided on the bottom of a showerhead body 55 of the showerhead 50.

As shown in FIG. 2, the injection openings 52 and 54 are uniformly distributed on the entire gas injection surface 57. In FIG. 2, the diameter of each of the injection openings 52 is larger than the diameter of each of the injection openings 54 for the same of easy recognition of each of the injection openings 52 and 54. However, the diameter of each of the injection openings 52 and 54 may be equal to each other, or the diameter of each co of the injection openings 54 may be larger than the diameter of each of the injection openings 52.

The interior of the showerhead body 55 is separated into a raw material gas head space 56 and an oxidant gas head space 58.

The raw material gas head space 56 includes inner raw material gas head spaces 56A and outer raw material gas head spaces 56B. The inner raw material gas head spaces 56A are formed as concentric annular spaces, and the outer raw material gas head spaces 56B are also formed as concentric annular spaces surrounding the inner raw material gas head spaces 56A. The inner raw material gas head spaces 56A communicate with each other by passages (not shown in the figure), and the outer raw material gas head spaces 56b communicate with each other by passages (not shown in the figure)

Similarly, the oxidant gas head space 58 includes inner oxidant gas head space 58A and outer oxidant gas head space 58B. The inner oxidant gas head space 58A is formed in the center of the showerhead body 55, and the outer oxidant gas head space 58B is formed as an annular space surrounding the inner oxidant gas head space 58A.

Accordingly, the interior of the showerhead body 55 is divided into four spaces 56A, 56B, 58A and 58B. It should be noted that the configuration and arrangement of the four spaces is not limited to that shown in FIG. 3, and other configuration and arrangement may be used.

The inner raw material gas head spaces 56A are connected to a first raw material gas supply passage 62 via a gas introduction port 60. The outer raw material gas head spaces 56B are connected to a second raw material gas supply passage 66 via a gas introduction port 64. A first open/close valve 67A is provided in the middle of the passage 62, and a second open/close valve 67B is provided in the middle of the passage 66.

The first and second raw material gas supply passages 62 and 66 are merged, and, then, branched into three branch passages 68A, 68B and 68C. The branch passages 68A, 68B and 68C are connected to flow controllers such as mass-flow controllers 70A, 70B and 70C, respectively, so that the material gases $Pb(DPM)_2$, $Zr(t-OC_4H_9)_4$ and $Ti(I-OC_3H_7)_4$ are supplied at predetermined flow rates, respectively.

Accordingly, the three kinds of gases are mixed to each other to produce the raw material gas in the middle of the passage, and the raw material gas is selectively supplied to the inner raw material gas head spaces 56A and the outer raw material gas head spaces 56B as described later. It should be noted that a tape heater (not shown in the figure) is wound on each of the fist and second raw material gas supply passages 62 and 66 and the branch passages 68A, 68B and 68C so as to prevent the gases from being liquidized. Additionally, the branch passage 68 is provided with a fifth open/close valve 67E so as to control the supply of the Zr material gas.

Additionally, the inner oxidation gas head space 58A is connected to a first oxidation gas supply passage 74 via a gas introduction port 72, and the outer oxidation gas head space 58B is connected to a second oxidation gas supply passage 78 via a gas introduction port 76. A third and fourth open/close valves 67C and 67D are provided in the middle of the first and second oxidant gas supply passages 74 and 78, respectively.

The first and second oxidant gas supply passages 74 and 78 are merged to a passage 80. A flow controller such as a mass-flow controller 82 is provided to the passage 80, so as to selectively supply the $NO_2$ gas to the inner and outer oxidant gas head spaces 58A and 58B at a predetermined flow rate as described later.

Each of the injection openings 52 for injecting the raw material gas communicates with either the inner raw material gas head spaces 56A or the outer raw material gas head spaces 56B. Each of the injection openings for injecting the oxidant gas communicates with either the inner oxidant gas head space 58A or the outer oxidant gas head space 58B.

Specifically, as shown in FIG. 2, the gas injection surface 57 is divided into two zones, one is an inner zone 84 and the other is an outer zone 86. The inner zone 84 is located in the center of the gas injection surface 57. The outer zone 86 has an annular shape so as to surround the inner zone 84. In FIG. 2, the boundary between the inner zone 84 and the outer zone is indicated by a single dashed chain line 88.

The gas injection openings 52A arranged within the inner zone 84 are connected to the inner raw material gas head spaces 56A, and the gas injection openings 52B arranged within the outer zone 86 are connected to the outer raw material gas head spaces 56B. The gas injection openings 54A arranged within the inner zone 84 are connected to the inner oxidant gas head space 58A, and the gas injection openings 54B arranged within the outer zone 86 are connected to the outer oxidant gas head space 58B.

According to the above-mentioned structure, at the initial stage of the film deposition process in which the process chamber is maintained at a high vacuum to form a crystalline nucleus, the raw material gas lacking Zr material is introduced into the process chamber 4 from the gas injection openings 52A located in the inner zone 84, and the oxidant gas is introduced into the process chamber 4 from the gas injection openings 52B located in the outer zone 86. On the other hand, after the pressure of the process chamber 4 is changed to a low vacuum, the raw material gas and the oxidant gas are introduced from the entire gas injection surface 57 of the showerhead 50. In order to achieve such a gas introduction process during the film deposition process, a valve open/close control means 90 is provided to control the operation of each of the first to fifth open/close valves 67A. 67B, 67C, 67D and 67E.

The inner raw material gas head spaces 56A and the outer raw material gas head spaces 56B are provided with capacitor manometers 92A and 92B as a pressure detecting means, respectively, so as to detect a pressure inside the respective spaces. Similarly, the inner oxidant gas head space 58A and the outer oxidant gas head space 58B are provided with capacitor manometers 92C and 92D as a pressure detecting means, respectively, so as to detect a pressure inside the respective spaces. The output of each of the manometers 92A to 92D is supplied to a dilution gas introducing amount control means 94, which is achieved by a microcomputer.

The first and second raw material gas supply passages 62 and 66 are connected to an inner gas passage 96, and the first and second oxidant gas supply passages 74 and 78 are connected to an inert gas passage 98. Each of the inert gas passages serves as a dilution gas introducing means to supply $N_2$ gas which is an inert gas as a dilution gas. The inert gas passages 96 and 98 are provided with flow controller 100 and 102 such as mass-flow controllers, respectively, so as to control the flow rate of the inert gas to an appropriate value in accordance with the control of the dilution gas introduction control means 94.

A description will now be given of the film deposition process performed by the film deposition apparatus 2 having the above-mentioned structure.

The semiconductor wafer W to be processed is conveyed to the process chamber 4 that is maintained at a vacuum, and the wafer W is placed on the table 18. Then, the wafer W is heated by the resistance heater 22 to be a predetermined process temperature. Thereafter, the film deposition process is started by introducing the raw material gas and the oxidant gas into the process chamber 4 from the showerhead 50 while maintaining the process chamber 4 at a predetermined process pressure.

The raw material gas is a mixture gas prepared by mixing gases, which are prepared by evaporating liquidized $Pb(DPM)_2$, $Zr (t-OC_4H_9)_4$ and $Ti(I-OC_3H_7)_4$, by flowing at predetermined flow rates, respectively. In the first process which is performed under a first vacuum environment to form the crystalline nucleus, the flow rates of the Pb, Zr and Ti material gases are controlled to be within the ranges of 0.1 to 10 scam, 0 scam (no gas flow) and 0.1 to 10 sccm, respectively. In the second process which is performed under a second vacuum environment to grow the crystal, the flow rates of the Pb, Zr and Ti material gases are controlled to be within the ranges of 0.1 to 10 sccm, 0.1 to 10 sccm and 0.1 to 10 scam, respectively.

The raw material gas (mixture gas) supplied to the showerhead 50 via the first and second raw material gas supply passages 62 and 66 flows into the respective inner and outer raw material gas head spaces 56A and 56B. Thereafter, the raw material gas is introduced into the process chamber 4 via the gas injection openings 52 (52A and 52B) provided on the gas injection surface 57.

On the other hand, the $NO_2$ gas supplied to the showerhead 50 via the first and second oxidant gas passages 74 and 78 flows into the inner and outer oxidant gas head spaces 58A and 58B, respectively. Thereafter, the oxidant gas is introduced into the process chamber 4 via the gas injection openings 54 (54A and 54B) provided on the gas injection surface 57.

The raw material gas and the $NO_2$ gas introduced into the process space S in the process chamber 4 are mixed in the process space S and react with each other, which deposit the crystalline nucleus of the PTO film or the PZT film on the wafer W by the CVD action.

In the present embodiment, the film deposition process includes the first process for forming the crystalline nucleus of the PTO film under a high vacuum, and the second process for depositing the PZT film on the crystalline nucleus at a high deposition rate under a relatively low vacuum. Specifically, in the first process, only the raw material gas (lacking Zr material gas) is injected into the process chamber 4 from the inner zone 84 as indicated by thick arrows in FIG. 4A, and only the oxidant gas is introduced into the process chamber 4 from the outer zone 86 as indicated by thin arrows in FIG. 4A. On the other hand, in the second process, the raw material gas (containing the Zr material gas) and the oxidant gas are uniformly injected into the process chamber 4 from the entire gas injection surface 57 (both the inner zone 84 and the outer zone 86) as indicated by thick and thin arrows in FIG. 4B.

More specifically, referring to FIG. 3, when the first process is performed, the second, third and fifth open/close valves 67B, 67C and 67E are closed and the first and fourth open/close valves 67A and 67D are open by the control of the valve control means 90 so as to supply the raw-material gas (lacking Zr material gas) to the inner raw material gas head spaces 56A and supply the oxidant gas to the outer oxidant gas head space 58B. Thereby, the raw material gas (lacking Zr material gas) is introduced into the process space S from the injection openings 52A in the inner zone 84, and the oxidant gas is introduced into the process space S from the injection openings 54B in the outer zone 86.

In the first process, the process temperature is in the range from 400° C. to 450° C., and the process pressure is a high vacuum such as less than 100 mTorr, preferably 100 mTorr. As mentioned above, by supplying only the raw material gas (lacking Zr material gas) from the center portion of the showerhead body 55 and supplying the oxidant gas so as to surrounds the raw material gas, the crystalline nucleus of the PTO film can be formed on the wafer W under a high vacuum.

Additionally, in the first process performed under the high vacuum, a distance between the wafer W and the showerhead 50 is increased by operating the drive shaft 162 (drive mechanism) so as to vertically move the table 18. The distance between the wafer W and the showerhead 50 is in the range from 20 mm to 150 mm. In the high vacuum environment, the raw material gas and the oxidant gas reach the wafer W according to diffusion (molecular flow). Accordingly, the raw material gas and the oxidant gas diffuses more sufficiently as the distance between the showerhead 50 and wafer W increases, which improves uniformity of the deposited film. Additionally, since the pressure distribution under the high vacuum environment is relatively uniform, the efficiency of material usage can be maintained unchanged even if the distance between the showerhead 50 and the wafer W is varied.

After the crystalline nucleus of the PTO film is formed in the first process, the operation proceeds to the second process, which is performed under the second vacuum environment.

When the second process is performed, all the first to fifth open/close valves 67A to 67E are open so as to introduce the raw material gas (containing Zr material gas into the inner and outer raw material gas head spaces 56A and 56B and the oxidant gas into the inner and outer oxidant gas head spaces 58A and 58B. Thereby, the raw material gas is injected from all of the injection openings 52A and 52B, and the oxidant gas is injected from all of the injection openings 54A and 54B. Accordingly, both the raw material gas and the oxidant gas are uniformly injected from the entire injection surface 57 of the showerhead 50.

In the second process, the process temperature is in the range from 400° C. to 450° C., and the process pressure is a relatively low vacuum such as greater than 100 mTorr, preferably in the range from 100 mTorr to 1000 mTorr.

Additionally, in the second process performed under the relatively low vacuum, a distance between the wafer W and the showerhead 50 must be smaller than that in the first process performed under the high vacuum environment. Specifically, the distance between the wafer W and the showeread 50 is in the range from 5 mm to 30 mm. In the low vacuum environment, the raw material gas and the oxidant gas reach the wafer W according to viscous flow. Accordingly, the efficiency of usage of the raw material gas and the oxidant gas decreases as the distance between the showerhead 50 and wafer W increases. This means that the efficiency of usage of raw material gas and the oxidant gas increases as the distance between the showerhead 50 and wafer W decreases, which increases a film deposition rate.

Additionally, according to the showerhead 50 having the above-mentioned design structure, the gases injected from the showerhead 50 form a stratified flow in the low vacuum environment. Accordingly, the uniformity in the deposited film rarely deteriorates when the distance between the showerhead 50 and the wafer W is small. Additionally, in the low vacuum environment, a gas layer having a thickness of less than several millimeters, which is referred to as a boundary layer, is formed above the wafer surface. The intensity of gases in the boundary layer increases as the distance between the showerhead 50 and the wafer W decreases. Accordingly, the film deposition rate increases as the distance between the showerhead 50 and the wafer W decreases.

The crystal of the PZT film normally grows at a temperature of about 600° C. However, as mentioned above, the formation of the crystal nucleus comprising the oxide of Pb and Ti on the wafer W allows deposition of the PZT film at a high deposition rate at a relatively low temperature ranging from 400° C. to 450° C. due to the influence by the PTO crystalline nucleus.

Figure 5:
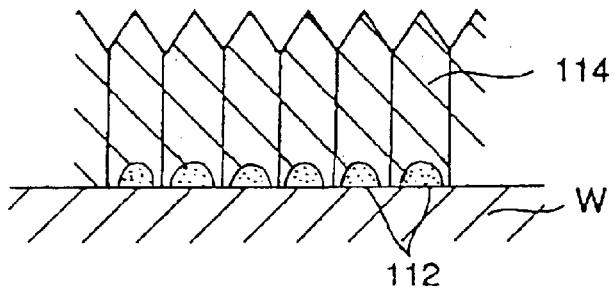
FIG. 5 is an illustration of a crystal nucleus and a PZT film formed on the crystal nucleus.

Thereby, the PZT film can be deposited at a high deposition rate on the crystal nucleus formed in the first process. Additionally, the uniformity of each element in the deposited PZT film can be very high. The thus-formed PZT film has a perovskite structure of $Pb(Zr_{1-x})O_3$. FIG. 5 is an illustration of the crystal nucleus and the PZT film formed on the crystal nucleus. As shown in FIG. 5, a plurality of PTO crystal nucleuses 112 are formed on the wafer W in the first process, and, then, the PZT film 114 grows on the PTO crystal nucleuses 112 in the second process.

Additionally, in the present embodiment, a pressure in each of the head spaces 56A. 56B, 58A and 58B is maintained unchanged so that the raw material gas and the oxidant gas do not leak within the showerhead body 55 or the raw material gas and the oxidant gas do not reverse flow into the showerhead body 55. The showerhead body 55 is fabricated by joining aluminum blocks each of which has cavities corresponding to the head spaces and the gas passages. It is inevitable to completely eliminate a small gap between the joined portions of the aluminum blocks even if the aluminum blocks are machined with very high accuracy.

Accordingly, if, for example, a large pressure difference is generated between the raw material gas head space 56 and the oxidant gas head space 58, one of the raw material gas and the oxidant gas leaks through the small gap, which results in mixture of the raw material gas and the oxidant gas within the showerhead body 55. In such a case, particles may be formed by the reaction of the raw material gas with the oxidant gas. Such a phenomenon may also occur if one of the raw material gases reversely flows into the injecting openings corresponding to the other gas.

In order to eliminate such a problem, in the present embodiment, the pressure in each of the head of spaces 56A, 56B, 58A and 58B is detected by the respective one of the capacitor manometers 92A to 92D so as to control the pressures in the head spaces 56A, 56B, 58A and 58B are substantially equal to each other by adding the dilution gas ($N_2$ gas). In this case, the pressure difference between-the head spaces is not required to be accurately controlled to zero, and there is no problem is the pressure difference is maintained to be less than 10%. As mentioned above, by appropriately supplying $N_2$ dilution gas to the space of which pressure is lower than the pressure in the adjacent space, the pressure difference between the spaces can be substantially eliminated. Thus, the gas leakage within the showerhead body 55 can be prevented, and the reverse flow of the injected gas to the showerhead body 55 can also be prevented.

Figure 6:
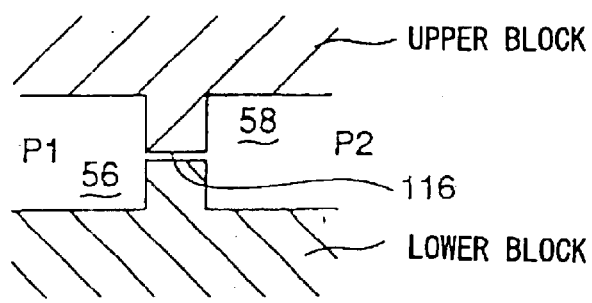
FIG. 6 is an illustration for explaining a small gap formed between adjacent head spaces in a showerhead body.

FIG. 6 is an illustration for explaining the small gap formed between adjacent head spaces-in the showerhead body 55. In a case in which the showerhead body 55 is formed by joining an upper block and a lower block each of which has a cavity to define the raw material gas head space 56 and the oxidant gas head space 58, a small gap 116 is formed between the blocks A and B. If there is a difference between the pressure P1 in the head space 56 and the pressure P2, the gas in one of the head spaces 56 and 59 leaks to the other. In the present embodiment, the pressure difference can be substantially eliminated by supplying the $N_2$ dilution gas to one of the head spaces 56 and 58 so as to maintain the pressure P1 and pressure P2 to be substantially equal to each other. Accordingly, the gas leakage between the head spaces 56 and 58 can be prevented. It should be noted that the dilution gas is not limited to the $N_2$ gas, and other gases such as He gas or Ar gas may be used.

A shown in FIG. 2, the size (diameter) of the gas injection surface 57 is set to be within plus or minus 10% with respect to the wafer W. In this case, the diameter of the inner zone 84 is preferably in a range from 10% to 70% of the effective diameter of the gas injection surface 57.

Figure 7:
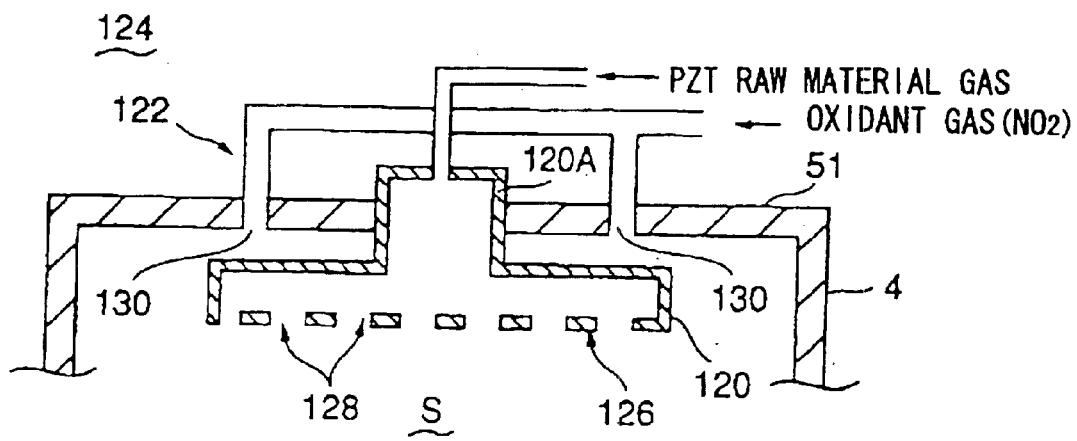
FIG. 7 is a cross-sectional view of a process gas introducing part provided in a film deposition apparatus according to a second embodiment of the present invention.
Figure 8:
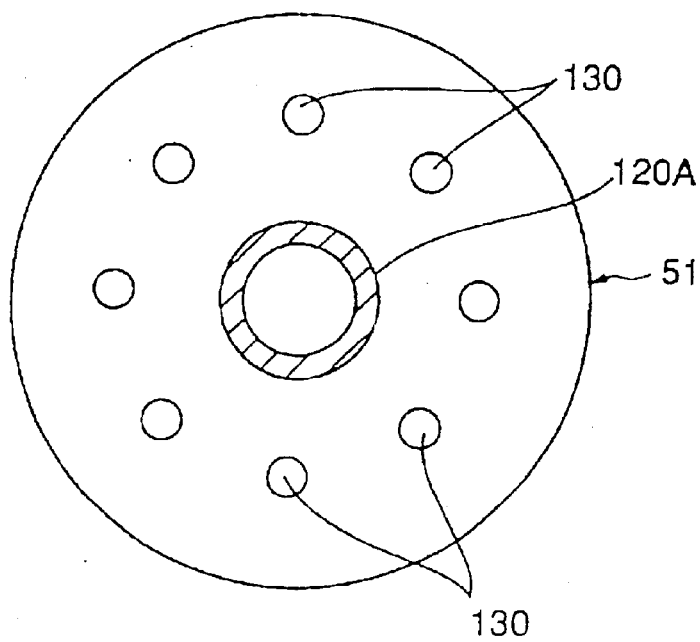
FIG. 8 is a plan view of a top plate of the process gas introducing part shown in FIG. 7.

A description will now be given, with reference to FIGS. 7 and 8, of a second embodiment of the present invention. FIG. 7 is a cross-sectional view of a process gas introducing part provided in the film deposition apparatus according to the second embodiment of the present invention. FIG. 8 is a plan view of a top plate of the process gas introducing part shown in FIG. 7.

The structure of the film deposition apparatus according to the second embodiment of the present invention is the same as the film deposition apparatus 2 shown in FIG. 1 except for the process gas introducing part shown in FIG. 7, and descriptions thereof will be omitted.

In the present embodiment, a showerhead 120 as a first process gas introducing means is attached to a top plate 51 of the process chamber 4. The showerhead 120 has a mounting portion 120A protrudingly formed in the center thereof. The mounting portion 120A is mounted to the top plate 51 of the process chamber 4, and a plurality of process gas supply passages 122 as a process gas introducing means are provided around the mounting portion 120A. The showerhead 120 and the process gas supply passages 122 together constitute a process gas introducing means 124. The showerhead 120 has a bell-jar shape having a single interior space. A plurality of injection openings 128 are formed in a gas injection surface 126. One of the raw material gas or the oxidant gas is supplied to the showerhead 120. In FIG. 7, the raw material gas is supplied to the showerhead 120.

The gas introducing means 122 includes a plurality of gas openings 130 arranged around the mounting portion 120A at substantially equal intervals so that the $NO_2$ gas as the oxidant gas is injected toward the process space S. In-this case,-the diameter L1 of a circle along which the gas openings are arranged is smaller than the diameter of the showerhead 120 so that a top plate of the showerhead 120 serves as a baffle plate, when the oxidant gas is injected, so as to promote the diffusion of the oxidant gas.

In the present embodiment, the PZT raw material gas is injected from the showerhead 120 to the process space S, and the oxidant gas is injected from the gas openings 130 of the gas introducing means 122 provided around the showerhead 120. Thereby, a PZT film having high uniformity of compositions can be deposited on the wafer W. Additionally, the structure of the process gas introducing means 124 can be simplified, and there is no leak within the showerhead 120. Further, since the structure of the process gas introducing means is simple, other mechanism such as a cooling mechanism, a heating mechanism or a high-frequency mechanism can be easily incorporated into the process chamber 4.

Figure 9:
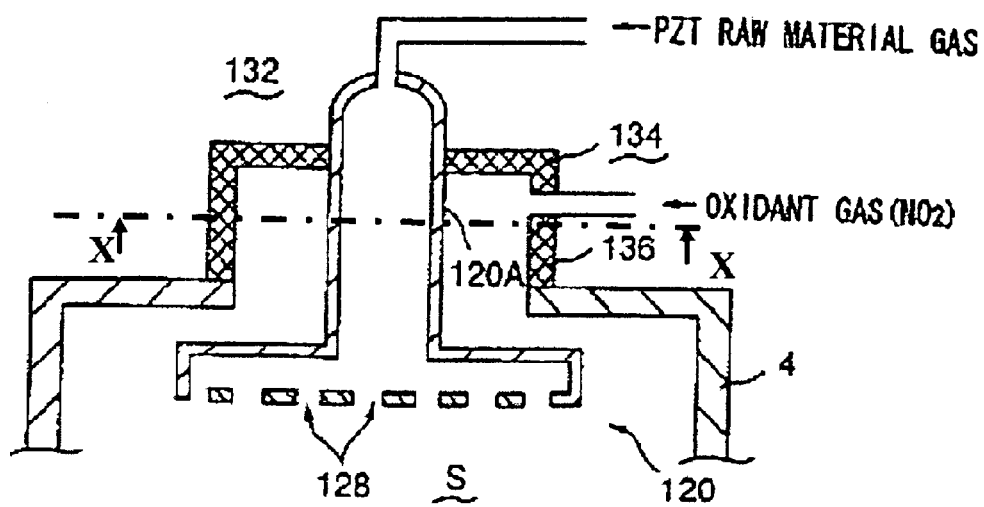
FIG. 9 is a cross-sectional view of a process gas introducing part provided in a film deposition apparatus according to a third embodiment of the present invention.
Figure 10:
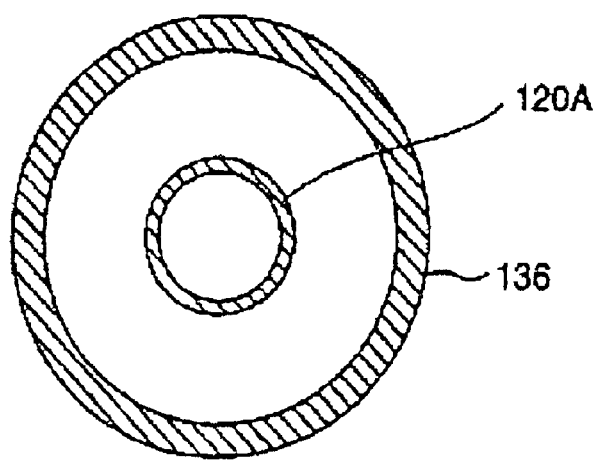
FIG. 10 is a cross-sectional view taken along a line X—X of FIG. 9.

A description will now be given, with reference to FIGS. 9 and 10, of a third embodiment of the present invention. FIG. 9 is a cross-sectional view of a process gas introducing part provided in a film deposition apparatus according to the third embodiment of the present invention. FIG. 10 is a cross-sectional view taken along a line X—X of FIG. 9.

The structure of the film deposition apparatus according to the third embodiment of the present invention is the same as the film deposition apparatus 2 shown in FIG. 1 except for the process gas introducing part 132 shown in FIG. 9, and descriptions thereof will be omitted. It should be noted that the process gas introducing part 132 has the showerhead 120 of the above-mentioned second embodiment.

In the present embodiment, the mounting portion 120A of the showerhead 120 has an elongated shape. Additionally, a second gas introducing means 134 includes an outer cylinder 136 that surrounds the mounting portion 120A so as to form a double tube structure. The mounting portion 120A is mounted to a top plate of the outer cylinder 136. The diameter of the bottom opening of the outer cylinder 136 is smaller than the diameter of the showerhead 120 so that the top plate of the showerhead 120 serves as a baffle plate.

According to the present embodiment, a PZT film having high uniformity of compositions can be deposited on the wafer W. Additionally, the structure of the process gas introducing means 132 is simple, and there is no leak within the showerhead 120.

Figure 11:
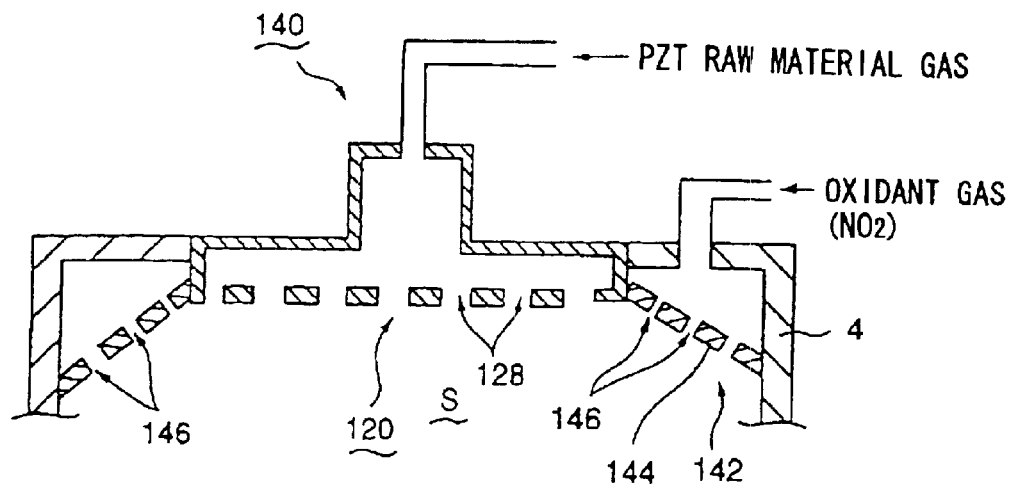
FIG. 11 is a cross-sectional view of a process gas introducing part provided in a film deposition apparatus according to a fourth embodiment of the present invention.

A description will now be given, with reference to FIG. 11, of a fourth embodiment of the present invention. FIG. 11 is a cross-sectional view of a process gas introducing part provided in a film deposition apparatus according to the fourth embodiment of the present invention.

The structure of the film deposition apparatus according to the fourth embodiment of the present invention is the same as the film deposition apparatus 2 shown in FIG. 1 except for the process gas introducing part 140 shown in FIG. 11, and descriptions thereof will be omitted. It should be noted that the process gas introducing part 140 has the showerhead 120 of the above-mentioned second embodiment.

In the present embodiment, the process gas introducing part 140 comprises the bell-jar type showerhead 120 as a first gas introducing means and a second gas introducing means 142 provided around the showerhead 120. The gas introducing means 142 includes an annular separation plate that connect the side wall of the showerhead 120 and the side wall of the process chamber 4 so as to form a separate showerhead defined by the annular plate 144 and the side wall and the top plate of the process chamber 4. A plurality of gas openings 146 are provided in the annular plate 144 so that the $NO_2$ gas is injected from the gas openings 146 toward the process space S.

According to the present embodiment, a PZT film having high uniformity of compositions can be deposited on the wafer W. Additionally, the structure of the process gas introducing part 140 is simple, and there is no leak within the showerhead 120.

Figure 12:
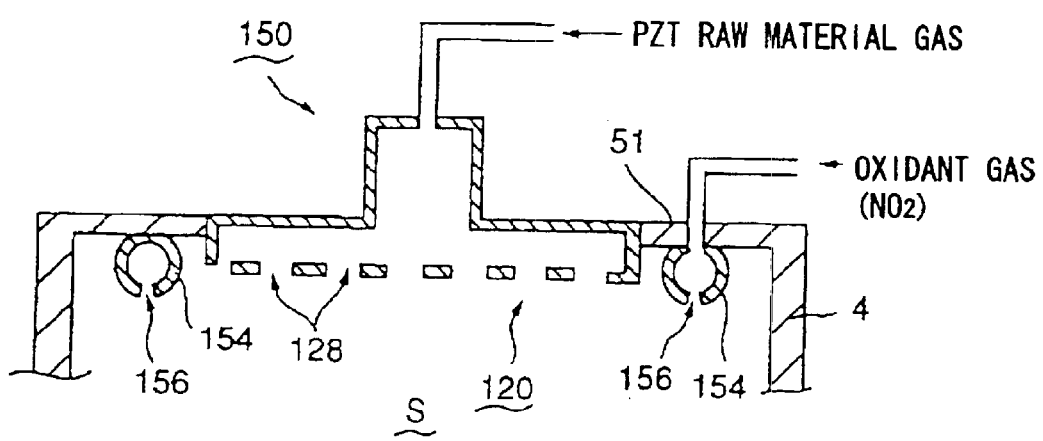
FIG. 12 is a cross-sectional view of a process gas introducing part provided in a film deposition apparatus according to a fifth embodiment of the present invention.
Figure 13:
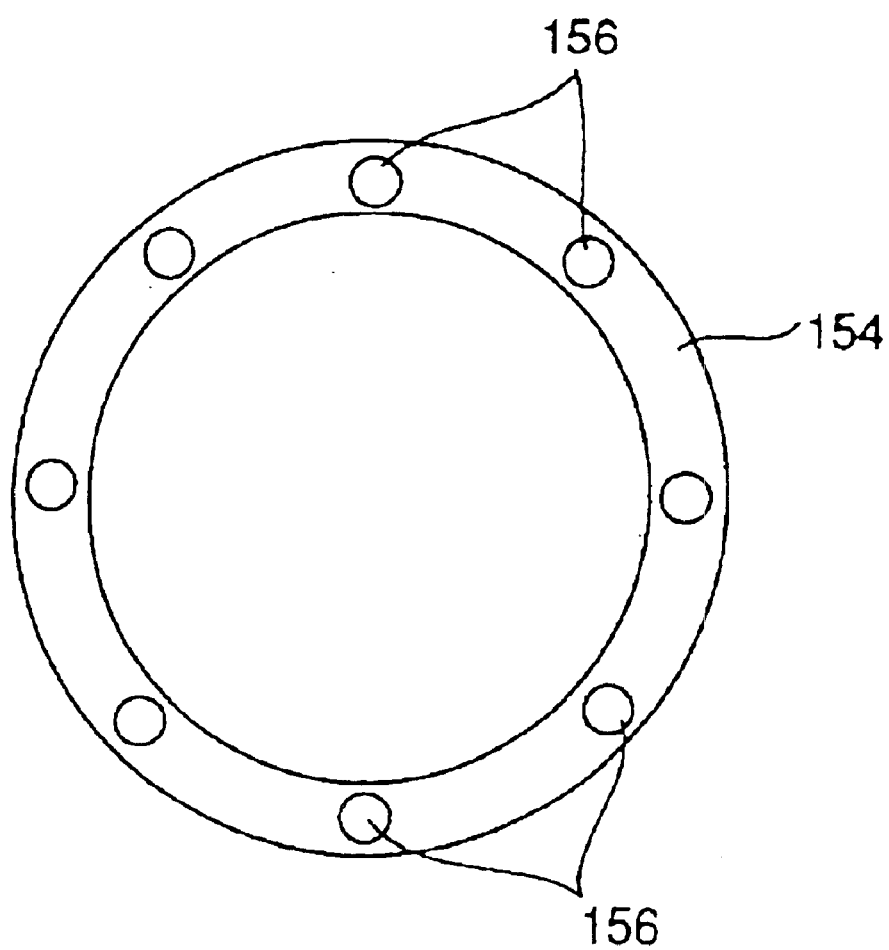
FIG. 13 is a plan view of a gas-introducing pipe shown in FIG. 12.

A description will now be given, with reference to FIGS. 12 and 13, of a fifth embodiment of the present invention. FIG. 12 is a cross-sectional view of a process gas introducing part provided in a film deposition apparatus according to the fifth embodiment of the present invention. FIG. 13 is a plan view of a gas introducing pipe shown in FIG. 12.

The structure of the film deposition apparatus according to the fifth embodiment of the present invention is the same as the film deposition apparatus 2 shown in FIG. 1 except for the process gas introducing part 150 shown in FIG. 12, and descriptions thereof will be omitted. It should be noted that the process gas introducing part 150 has the showerhead 120 of the above-mentioned second embodiment.

In the present embodiment, the process gas introducing part 150 comprises the bell-jar type showerhead 120 and a gas introducing means 152 provided around the showerhead 120. The gas introducing means 152 includes a ring-like gas introducing pipe 154 mounted on the top plate 51 of the process chamber 4. A plurality of gas openings 156 are provided along the gas introducing pipe 154 at substantially equal intervals so that the $NO_2$ gas is injected from the gas openings 156 toward the process space S.

According to the present embodiment, a PZT film having high uniformity of compositions can be deposited on the wafer W. Additionally, the structure of the process gas introducing part 150 is simple, and there is no leak within the showerhead 120.

In the above-mentioned embodiments, a 6-inch wafer is used. However, the size of the wafer W is not limited to 6 inches, and other size wafers such as 8-inch wafer or 12-inch wafer may be used. In such a case, the diameter of the inner zone 84 may be increased in response to the increase in the wafer diameter.

Additionally, although $Zr(t-OC_4H_9)_4$ is used as the Zr material to form the PZT film in the above-mentioned embodiments, other Zr materials such as $Zr(DPM)_4$, $Zr(I-OC_3H_7)_4$, $Zr(C_5H_7O_2)_4$ or $Zr(C_5HF_6O_2)_4$ and a combination of two or more of the aforementioned may be used. Further, although $Ti(i-OC_3H_7)_4$ is used as the Ti material in the above-mentioned embodiments, other Ti materials such as $Ti(i-OC_3H_7)_2(DPM)_2$ may be used.

Additionally, although the PZT film as a dielectric film is deposited by the film deposition apparatus according to the above-mentioned embodiments, the present invention is not limited to the deposition of the PZT film, and other films such as a $BaSr_{1-x}TixO_3$ film may be deposited by using other organometallic materials.

Further, the oxidant gas is not limited to $NO_2$ gas, and other gases such as $O_2$, $O_3$ or $N_2O$ and a combination of two or more of the aforementioned may be used. Additionally, the object to be processed is not limited to the semiconductor wafer, and other object such as an LCD substrate or a glass substrate may be used.

The present invention is not limited to the specifically disclosed embodiments, and variations and modifications may be made without departing from the scope of the present invention.

The present application is based on Japanese priority patent application No. 11-245836 filed on Aug. 31, 1999, the entire contents of which are hereby incorporated by reference.

What is claimed is:

1. A film depositing apparatus for depositing a film on an object to be processed, the film deposition apparatus comprising:

a process chamber accommodating the object therein;

process gas supplying means for supplying process gases including a raw material gas and an oxidant gas;

evacuating means for evacuating the process gases from said process chamber so as to maintain said process chamber to be at a predetermined vacuum;

process gas introducing means for introducing the process gases supplied from said process gas supplying means into said process chamber;

pressure detecting means for detecting a pressure of each of the raw material gas and the oxidant gas in said process gas introducing means;

dilution gas adding means for adding a dilution gas to one of the raw material gas and the oxidant gas; and dilution gas amount control means for controlling an amount of the dilution gas to be added based on the pressure detected by said pressure detecting means so that the pressures of the raw material gas and the oxidant gas in said process gas introducing means are substantially equal to each other, wherein said process gas introducing means is configured and arranged to inject the process gases toward an entire surface of the object, a gas injecting surface from which the process eases are injected being divided into an inner zone covering a center portion of the object and an outer zone surrounding the inner zone, and wherein said process gas supplying means selectively supplies the process gases to said process gas introducing means so that the raw material gas is separately injected from said inner zone and said outer zone and the oxidant gas is separately injected from said inner zone and said outer zone.

2. A film deposition apparatus for depositing a film on an object to be processed, the film deposition apparatus comprising:

a process chamber accommodating the object therein;

process gas supplying means for supplying process gases including a raw material gas and an oxidant gas;

evacuating means for evacuating the process gases from said process chamber so as to maintain said process chamber to be at a predetermined vacuum; and process gas introducing means for introducing the process gases supplied from said process gas supplying means into said process chamber, wherein said process gas introducing means is configured and arranged to inject the process gases toward an entire surface of the object, a gas injecting surface from which the process gases are injected being divided into an inner zone covering a center portion of the object and an outer zone surrounding the inner zone, wherein said process gas supplying means selectively supplies the process gases to said process gas introducing means so that the raw material gas is separately injected from said inner zone and said outer zone and the oxidant gas is separately injected from said inner zone and said outer zone, wherein said process gas supplying means includes switching means for switching the supply of the raw material gas to said process gas introducing means so that the raw material gas is selectively injected from either said inner zone alone or both said inner zone and said outer zone, and the oxidant gas is selectively injected from either said outer zone alone or both said inner zone and said outer zone, wherein said process gas supplying means includes a first raw material gas supply passage supplying the raw material gas to said inner zone, a second raw material gas supply passage supplying the raw material gas to said outer zone, a first oxidant gas supply passage supplying the oxidant gas to said inner zone and a second oxidant gas supply passage supplying the oxidant gas to said outer zone, wherein said switching means includes a first open/close valve provided to said first raw material gas supply passage, a second open/close valve provided to said second raw material gas passage, a third open/close valve provided to said first oxidant gas supplying passage and a fourth open/close valve provided to said second oxidant gas supply passage, and wherein said process gas introducing means comprises a showerhead having a plurality of raw material gas injection openings and a plurality of oxidant gas injection openings uniformly arranged on a bottom surface thereof, said bottom surface corresponding to said gas injection surface divided into said inner zone and said outer zone, said showerhead includes:
an inner raw material gas head space connected to said first raw material gas supply passage, a part of said injection openings located in said inner zone being connected to said inner raw material head space;
an outer raw material gas head space connected to said second raw material gas supply passage, a part of said injection openings located in said outer zone being connected to said outer raw material head space;
an inner oxidant gas head space connected to said first oxidant gas supply passage, a part of said injection openings located in said inner zone being connected to said inner oxidant gas head space; and
an outer oxidant gas head space connected to said second oxidant gas supply passage, a part of said injection openings located in said outer zone being connected to said outer oxidant gas head space.

* * * * *